United States Patent
Ayyapureddi et al.

(10) Patent No.: US 11,600,314 B2
(45) Date of Patent: Mar. 7, 2023

(54) APPARATUSES AND METHODS FOR SKETCH CIRCUITS FOR REFRESH BINNING

(71) Applicant: MICRON TECHNOLOGY, INC., Boise, ID (US)

(72) Inventors: Sujeet Ayyapureddi, Boise, ID (US); Donald M. Morgan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/201,941

(22) Filed: Mar. 15, 2021

(65) Prior Publication Data

US 2022/0293166 A1    Sep. 15, 2022

(51) Int. Cl.
| | | |
|---|---|---|
| G11C 11/406 | (2006.01) | |
| G11C 11/408 | (2006.01) | |
| G11C 29/42 | (2006.01) | |
| G11C 29/44 | (2006.01) | |
| G11C 29/12 | (2006.01) | |

(52) U.S. Cl.
CPC ....... *G11C 11/40611* (2013.01); *G11C 11/408* (2013.01); *G11C 29/42* (2013.01); *G11C 29/44* (2013.01); *G11C 2029/1202* (2013.01)

(58) Field of Classification Search
CPC ................................................. G11C 11/4061
See application file for complete search history.

(56) References Cited

U.S. PATENT DOCUMENTS

| | | | |
|---|---|---|---|
| 1,158,364 A | 10/1915 | Bibb | |
| 3,633,175 A | 1/1972 | Harper | |
| 5,291,198 A | 3/1994 | Dingwall et al. | |
| 5,299,159 A | 3/1994 | Balistreri et al. | |
| 5,422,850 A | 6/1995 | Sukegawa et al. | |
| 5,638,317 A | 6/1997 | Tran | |
| 5,699,297 A | 12/1997 | Yamazaki et al. | |
| 5,768,196 A | 6/1998 | Bloker et al. | |

(Continued)

FOREIGN PATENT DOCUMENTS

| | | |
|---|---|---|
| CN | 1144434 A | 3/1997 |
| CN | 1195173 A | 10/1998 |

(Continued)

OTHER PUBLICATIONS

US 11,264,075 B2, 03/2022, Bell et al. (withdrawn)

(Continued)

*Primary Examiner* — Min Huang
(74) *Attorney, Agent, or Firm* — Dorsey & Whitney LLP

(57) ABSTRACT

Apparatuses, systems, and methods for sketch circuits for refresh binning. The rows of a memory may have different information retention times. The row addresses may be sorted into different bins based on these information retention times. In order to store information about which row addresses are associated with which bins a sketch circuit may be used. When an address is generated as part of a refresh operation, it may be used to generate a number of different hash values, which may be used to index entries in a storage structure. The entries may indicate which bin the address is associated with. Based on the binning information, the memory may refresh the address at different rates (e.g., by determining whether to provide the address as a refresh address or not).

28 Claims, 7 Drawing Sheets

(56) References Cited

U.S. PATENT DOCUMENTS

| | | | |
|---|---|---|---|
| 5,933,377 A | 8/1999 | Hidaka | |
| 5,943,283 A | 8/1999 | Wong et al. | |
| 5,970,507 A | 10/1999 | Kato et al. | |
| 5,999,471 A | 12/1999 | Choi | |
| 6,002,629 A | 12/1999 | Kim et al. | |
| 6,011,734 A | 1/2000 | Pappert | |
| 6,061,290 A | 5/2000 | Shirley | |
| 6,212,118 B1 | 4/2001 | Fujita | |
| 6,310,806 B1 | 10/2001 | Higashi et al. | |
| 6,317,381 B1 | 11/2001 | Gans et al. | |
| 6,373,738 B1 | 4/2002 | Towler et al. | |
| 6,392,952 B1 | 5/2002 | Chen et al. | |
| 6,424,582 B1 | 7/2002 | Ooishi | |
| 6,434,064 B2 | 8/2002 | Nagai | |
| 6,452,868 B1 | 9/2002 | Fister | |
| 6,480,931 B1 | 11/2002 | Buti et al. | |
| 6,515,928 B2 | 2/2003 | Sato et al. | |
| 6,567,340 B1 | 5/2003 | Nataraj et al. | |
| 6,950,364 B2 | 9/2005 | Kim | |
| 7,027,343 B2 | 4/2006 | Sinha et al. | |
| 7,057,960 B1 | 6/2006 | Fiscus et al. | |
| 7,082,070 B2 | 7/2006 | Hong | |
| 7,187,607 B2 | 3/2007 | Koshikawa et al. | |
| 7,203,113 B2 | 4/2007 | Takahashi et al. | |
| 7,203,115 B2 | 4/2007 | Eto et al. | |
| 7,209,402 B2 | 4/2007 | Shinozaki et al. | |
| 7,215,588 B2 | 5/2007 | Lee | |
| 7,283,380 B1 | 10/2007 | Srinivasan et al. | |
| 7,319,602 B1 | 1/2008 | Srinivasan et al. | |
| 7,444,577 B2 | 10/2008 | Best et al. | |
| 7,551,502 B2 | 6/2009 | Dono et al. | |
| 7,565,479 B2 | 7/2009 | Best et al. | |
| 7,830,742 B2 | 11/2010 | Han | |
| 7,870,362 B2 | 1/2011 | Hong et al. | |
| 7,872,907 B2 | 1/2011 | Okayama et al. | |
| 8,174,921 B2 | 5/2012 | Kim et al. | |
| 8,400,805 B2 | 3/2013 | Yoko | |
| 8,451,677 B2 | 5/2013 | Okahiro et al. | |
| 8,625,360 B2 | 1/2014 | Iwamoto et al. | |
| 8,676,725 B1* | 3/2014 | Lin | G06N 20/00 706/14 |
| 8,681,578 B2 | 3/2014 | Narui | |
| 8,756,368 B2 | 6/2014 | Best et al. | |
| 8,811,100 B2 | 8/2014 | Ku | |
| 8,862,973 B2 | 10/2014 | Zimmerman et al. | |
| 8,938,573 B2 | 1/2015 | Greenfield et al. | |
| 9,032,141 B2 | 5/2015 | Bains et al. | |
| 9,047,978 B2 | 6/2015 | Bell et al. | |
| 9,058,900 B2 | 6/2015 | Kang | |
| 9,087,554 B1* | 7/2015 | Park | G11C 7/00 |
| 9,087,602 B2 | 7/2015 | Youn et al. | |
| 9,117,544 B2 | 8/2015 | Bains et al. | |
| 9,123,447 B2 | 9/2015 | Lee et al. | |
| 9,153,294 B2 | 10/2015 | Kang | |
| 9,190,137 B2 | 11/2015 | Kim et al. | |
| 9,190,139 B2 | 11/2015 | Jung et al. | |
| 9,251,885 B2 | 2/2016 | Greenfield et al. | |
| 9,286,964 B2 | 3/2016 | Halbert et al. | |
| 9,299,457 B2 | 3/2016 | Chun et al. | |
| 9,311,985 B2 | 4/2016 | Lee et al. | |
| 9,324,398 B2 | 4/2016 | Jones et al. | |
| 9,384,821 B2 | 7/2016 | Bains et al. | |
| 9,390,782 B2 | 7/2016 | Best et al. | |
| 9,412,432 B2 | 8/2016 | Narui et al. | |
| 9,424,907 B2 | 8/2016 | Fujishiro | |
| 9,484,079 B2 | 11/2016 | Lee | |
| 9,514,850 B2 | 12/2016 | Kim | |
| 9,570,143 B2 | 2/2017 | Lim et al. | |
| 9,646,672 B1* | 5/2017 | Kim | G11C 16/10 |
| 9,672,889 B2 | 6/2017 | Lee et al. | |
| 9,685,240 B1 | 6/2017 | Park | |
| 9,691,466 B1 | 6/2017 | Kim | |
| 9,697,913 B1 | 7/2017 | Mariani et al. | |
| 9,734,887 B1 | 8/2017 | Tavva | |
| 9,741,409 B2 | 8/2017 | Jones et al. | |
| 9,741,447 B2 | 8/2017 | Akamatsu | |
| 9,747,971 B2 | 8/2017 | Bains et al. | |
| 9,761,297 B1 | 9/2017 | Tomishima | |
| 9,786,351 B2 | 10/2017 | Lee et al. | |
| 9,799,391 B1 | 10/2017 | Wei | |
| 9,805,782 B1 | 10/2017 | Liou | |
| 9,805,783 B1 | 10/2017 | Ito et al. | |
| 9,818,469 B1 | 11/2017 | Kim et al. | |
| 9,847,118 B1 | 12/2017 | Won | |
| 9,865,326 B2 | 1/2018 | Bains et al. | |
| 9,865,328 B1 | 1/2018 | Desimone et al. | |
| 9,922,694 B2 | 3/2018 | Akamatsu | |
| 9,934,143 B2 | 4/2018 | Bains et al. | |
| 9,953,696 B2 | 4/2018 | Kim | |
| 10,032,501 B2 | 7/2018 | Ito et al. | |
| 10,083,737 B2 | 9/2018 | Bains et al. | |
| 10,090,038 B2 | 10/2018 | Shin | |
| 10,134,461 B2 | 11/2018 | Bell et al. | |
| 10,147,472 B2 | 12/2018 | Jones et al. | |
| 10,153,031 B2 | 12/2018 | Akamatsu | |
| 10,170,174 B1 | 1/2019 | Ito et al. | |
| 10,176,860 B1 | 1/2019 | Mylavarapu | |
| 10,210,925 B2 | 2/2019 | Bains et al. | |
| 10,297,305 B1 | 5/2019 | Moon et al. | |
| 10,339,994 B2 | 7/2019 | Ito et al. | |
| 10,381,327 B2 | 8/2019 | Ramachandra et al. | |
| 10,387,276 B2 | 8/2019 | Ryu et al. | |
| 10,446,216 B2 | 10/2019 | Oh et al. | |
| 10,490,251 B2 | 11/2019 | Wolff | |
| 10,600,462 B2 | 3/2020 | Augustine et al. | |
| 10,600,491 B2 | 3/2020 | Chou et al. | |
| 10,607,686 B2 | 3/2020 | Akamatsu | |
| 10,629,286 B2 | 4/2020 | Lee et al. | |
| 10,679,710 B2 | 6/2020 | Hirashima et al. | |
| 10,705,900 B2 | 7/2020 | Jin | |
| 10,770,127 B2 | 9/2020 | Shore et al. | |
| 10,811,066 B2 | 10/2020 | Jones et al. | |
| 10,832,792 B1 | 11/2020 | Penney et al. | |
| 10,861,519 B2 | 12/2020 | Jones et al. | |
| 10,867,660 B2 | 12/2020 | Akamatsu | |
| 10,930,335 B2 | 2/2021 | Bell et al. | |
| 10,943,636 B1 | 3/2021 | Wu et al. | |
| 10,950,289 B2 | 3/2021 | Ito et al. | |
| 10,964,378 B2 | 3/2021 | Ayyapureddi et al. | |
| 11,011,215 B1 | 5/2021 | Parry et al. | |
| 11,043,254 B2 | 6/2021 | Enomoto et al. | |
| 11,139,015 B2 | 10/2021 | Brown et al. | |
| 11,152,050 B2 | 10/2021 | Morohashi et al. | |
| 11,158,364 B2 | 10/2021 | Penney et al. | |
| 11,158,373 B2 | 10/2021 | Penney et al. | |
| 11,200,942 B2 | 12/2021 | Jenkinson et al. | |
| 11,222,682 B1 | 1/2022 | Enomoto et al. | |
| 11,257,535 B2 | 2/2022 | Shore et al. | |
| 11,264,096 B2 | 3/2022 | Schreck et al. | |
| 11,322,192 B2 | 5/2022 | Morohashi et al. | |
| 2001/0008498 A1 | 7/2001 | Ooishi | |
| 2002/0007476 A1 | 1/2002 | Kishino | |
| 2002/0078311 A1 | 6/2002 | Matsuzaki et al. | |
| 2002/0080677 A1 | 6/2002 | Watanabe et al. | |
| 2002/0181301 A1 | 12/2002 | Takahashi et al. | |
| 2003/0063512 A1 | 4/2003 | Takahashi et al. | |
| 2003/0067825 A1 | 4/2003 | Shimano et al. | |
| 2003/0090400 A1 | 5/2003 | Barker | |
| 2003/0123301 A1 | 7/2003 | Jang et al. | |
| 2003/0193829 A1 | 10/2003 | Morgan et al. | |
| 2003/0231540 A1 | 12/2003 | Lazar et al. | |
| 2004/0004856 A1 | 1/2004 | Sakimura et al. | |
| 2004/0008544 A1 | 1/2004 | Shinozaki et al. | |
| 2004/0022093 A1 | 2/2004 | Lee | |
| 2004/0052142 A1 | 3/2004 | Ikehashi et al. | |
| 2004/0114446 A1 | 6/2004 | Takahashi et al. | |
| 2004/0130959 A1 | 7/2004 | Kawaguchi | |
| 2004/0174757 A1 | 9/2004 | Garverick et al. | |
| 2004/0184323 A1 | 9/2004 | Mori et al. | |
| 2004/0213035 A1 | 10/2004 | Cavaleri et al. | |
| 2004/0218431 A1 | 11/2004 | Chung et al. | |
| 2005/0041502 A1 | 2/2005 | Perner | |
| 2005/0105315 A1 | 5/2005 | Shin et al. | |
| 2005/0243629 A1 | 11/2005 | Lee | |

(56) References Cited

U.S. PATENT DOCUMENTS

| | | |
|---|---|---|
| 2005/0265104 A1 | 12/2005 | Remaklus et al. |
| 2006/0083099 A1 | 4/2006 | Bae et al. |
| 2006/0087903 A1 | 4/2006 | Riho et al. |
| 2006/0176744 A1 | 8/2006 | Stave |
| 2006/0262616 A1 | 11/2006 | Chen |
| 2007/0008799 A1 | 1/2007 | Dono et al. |
| 2007/0014174 A1 | 1/2007 | Ohsawa |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0133330 A1 | 6/2007 | Ohsawa |
| 2007/0230264 A1 | 10/2007 | Eto |
| 2007/0237016 A1 | 10/2007 | Miyamoto et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0062742 A1 | 3/2008 | Wang |
| 2008/0126893 A1 | 5/2008 | Harrand et al. |
| 2008/0130394 A1 | 6/2008 | Dono et al. |
| 2008/0181048 A1 | 7/2008 | Han |
| 2008/0224742 A1 | 9/2008 | Pomichter |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0301362 A1 | 12/2008 | Cavanna et al. |
| 2008/0313494 A1 | 12/2008 | Hummler et al. |
| 2008/0316845 A1 | 12/2008 | Wang et al. |
| 2009/0021999 A1 | 1/2009 | Tanimura et al. |
| 2009/0059641 A1 | 3/2009 | Jeddeloh |
| 2009/0077571 A1 | 3/2009 | Gara et al. |
| 2009/0161457 A1 | 6/2009 | Wakimoto |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0213675 A1 | 8/2009 | Shino |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0051530 A1 | 3/2011 | Kushida |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0216614 A1 | 9/2011 | Hosoe |
| 2011/0225355 A1 | 9/2011 | Kajigaya |
| 2011/0286271 A1 | 11/2011 | Chen |
| 2011/0310648 A1 | 12/2011 | Iwamoto et al. |
| 2011/0317462 A1 | 12/2011 | Gyllenhammer et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2012/0254472 A1 | 10/2012 | Ware et al. |
| 2013/0003467 A1 | 1/2013 | Klein |
| 2013/0003477 A1 | 1/2013 | Park et al. |
| 2013/0057173 A1 | 3/2013 | Yao et al. |
| 2013/0107623 A1 | 5/2013 | Kavalipurapu et al. |
| 2013/0173971 A1 | 7/2013 | Zimmerman |
| 2013/0254475 A1 | 9/2013 | Perego et al. |
| 2013/0279284 A1* | 10/2013 | Jeong ................ G11C 11/40611 365/222 |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0078845 A1 | 3/2014 | Song |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0136763 A1 | 5/2014 | Li et al. |
| 2014/0143473 A1 | 5/2014 | Kim et al. |
| 2014/0177370 A1 | 6/2014 | Halbert et al. |
| 2014/0177376 A1 | 6/2014 | Song |
| 2014/0189215 A1* | 7/2014 | Kang ................ G11C 11/40622 711/106 |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0293725 A1 | 10/2014 | Best et al. |
| 2014/0317344 A1 | 10/2014 | Kim |
| 2014/0355332 A1 | 12/2014 | Youn et al. |
| 2014/0369109 A1 | 12/2014 | Lee et al. |
| 2014/0379978 A1* | 12/2014 | Kim ................ G11C 11/40622 711/106 |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0155027 A1 | 6/2015 | Abe et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0078845 A1 | 3/2016 | Lin et al. |
| 2016/0078911 A1 | 3/2016 | Fujiwara et al. |
| 2016/0078918 A1 | 3/2016 | Hyun et al. |
| 2016/0086649 A1 | 3/2016 | Hong et al. |
| 2016/0086651 A1 | 3/2016 | Kim |
| 2016/0093402 A1 | 3/2016 | Kitagawa et al. |
| 2016/0099043 A1 | 4/2016 | Tu |
| 2016/0111140 A1 | 4/2016 | Joo et al. |
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0163372 A1 | 6/2016 | Lee et al. |
| 2016/0172056 A1 | 6/2016 | Huh |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0211008 A1 | 7/2016 | Benedict et al. |
| 2016/0225433 A1 | 8/2016 | Bains et al. |
| 2016/0225461 A1 | 8/2016 | Tuers et al. |
| 2016/0336060 A1 | 11/2016 | Shin |
| 2016/0343423 A1 | 11/2016 | Shido |
| 2017/0011792 A1 | 1/2017 | Oh et al. |
| 2017/0076779 A1 | 3/2017 | Bains et al. |

(56) References Cited

U.S. PATENT DOCUMENTS

| | | | |
|---|---|---|---|
| 2017/0092350 A1 | 3/2017 | Halbert et al. |
| 2017/0117030 A1 | 4/2017 | Fisch et al. |
| 2017/0133085 A1 | 5/2017 | Kim et al. |
| 2017/0139641 A1 | 5/2017 | Cha et al. |
| 2017/0140807 A1 | 5/2017 | Sun et al. |
| 2017/0140811 A1 | 5/2017 | Joo |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0000257 A1 | 1/2018 | Lee et al. |
| 2018/0005690 A1 | 1/2018 | Morgan et al. |
| 2018/0025770 A1 | 1/2018 | Ito et al. |
| 2018/0060194 A1 | 3/2018 | Ryu et al. |
| 2018/0061483 A1* | 3/2018 | Morgan ............ G11C 11/40618 |
| 2018/0082737 A1 | 3/2018 | Lee |
| 2018/0084314 A1 | 3/2018 | Koyama |
| 2018/0090199 A1 | 3/2018 | Kim et al. |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0158504 A1 | 6/2018 | Akamatsu |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2018/0366182 A1* | 12/2018 | Hyun ................... G11C 11/418 |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0066759 A1 | 2/2019 | Nale |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0096492 A1 | 3/2019 | Cai et al. |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |
| 2019/0147964 A1 | 5/2019 | Yun et al. |
| 2019/0161341 A1 | 5/2019 | Howe |
| 2019/0172518 A1 | 6/2019 | Chen et al. |
| 2019/0196730 A1 | 6/2019 | Imran |
| 2019/0198078 A1 | 6/2019 | Hoang et al. |
| 2019/0198090 A1 | 6/2019 | Lee |
| 2019/0198099 A1 | 6/2019 | Mirichigni et al. |
| 2019/0205253 A1 | 7/2019 | Roberts |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1 | 8/2019 | Cha et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0333573 A1 | 10/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2019/0386557 A1 | 12/2019 | Wang et al. |
| 2020/0005857 A1 | 1/2020 | Ito et al. |
| 2020/0075106 A1 | 3/2020 | Tokutomi et al. |
| 2020/0082873 A1 | 3/2020 | Wolff |
| 2020/0090760 A1 | 3/2020 | Purahmad et al. |
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0202921 A1 | 6/2020 | Morohashi et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0321049 A1 | 10/2020 | Meier et al. |
| 2020/0349995 A1 | 11/2020 | Shore et al. |
| 2020/0365208 A1 | 11/2020 | Schreck et al. |
| 2020/0381040 A1 | 12/2020 | Penney et al. |
| 2020/0395072 A1 | 12/2020 | Penney et al. |
| 2021/0005229 A1 | 1/2021 | Hiscock et al. |
| 2021/0005240 A1 | 1/2021 | Brown et al. |
| 2021/0020223 A1 | 1/2021 | Ayyapureddi et al. |
| 2021/0020262 A1 | 1/2021 | Penney et al. |
| 2021/0026732 A1 | 1/2021 | Park et al. |
| 2021/0057012 A1 | 2/2021 | Ayyapureddi et al. |
| 2021/0057013 A1 | 2/2021 | Jenkinson et al. |
| 2021/0057021 A1 | 2/2021 | Wu et al. |
| 2021/0065755 A1 | 3/2021 | Kim et al. |
| 2021/0065764 A1 | 3/2021 | Cheng et al. |
| 2021/0142852 A1 | 5/2021 | Schreck et al. |
| 2021/0158851 A1 | 5/2021 | Ayyapureddi et al. |
| 2021/0158860 A1 | 5/2021 | Wu et al. |
| 2021/0158861 A1 | 5/2021 | Jeong et al. |
| 2021/0201984 A1 | 7/2021 | Khasawneh et al. |
| 2021/0225432 A1 | 7/2021 | Enomoto et al. |
| 2021/0241810 A1 | 8/2021 | Hollis et al. |
| 2021/0265504 A1 | 8/2021 | Ishizu et al. |
| 2021/0343324 A1 | 11/2021 | Brown et al. |
| 2021/0350844 A1 | 11/2021 | Morohashi et al. |
| 2021/0398592 A1 | 12/2021 | Penney et al. |
| 2021/0407583 A1 | 12/2021 | Penney et al. |
| 2022/0165347 A1 | 5/2022 | Pan |

FOREIGN PATENT DOCUMENTS

| | | |
|---|---|---|
| CN | 101038785 A | 9/2007 |
| CN | 101067972 A | 11/2007 |
| CN | 101331554 A | 12/2008 |
| CN | 101458658 A | 6/2009 |
| CN | 101622607 A | 1/2010 |
| CN | 102113058 A | 6/2011 |
| CN | 102483952 A | 5/2012 |
| CN | 104350546 A | 2/2015 |
| CN | 106710621 A | 5/2017 |
| CN | 107871516 A | 4/2018 |
| JP | H0773682 A | 3/1995 |
| JP | 2005-216429 A | 8/2005 |
| JP | 2011-258259 A | 12/2011 |
| JP | 4911510 B2 | 1/2012 |
| JP | 2013-004158 A | 1/2013 |
| KR | 20150002783 A | 1/2015 |
| KR | 20170058022 A | 5/2017 |
| KR | 1020180064940 A | 6/2018 |
| KR | 1020180085184 A | 7/2018 |
| KR | 20190048049 A | 5/2019 |
| WO | 2014120477 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2020191222 A1 | 9/2020 |
| WO | 2021003085 A1 | 1/2021 |

(56) References Cited

FOREIGN PATENT DOCUMENTS

OTHER PUBLICATIONS

U.S. Appl. No. 17/446,710 titled "Apparatuses, Systems, and Methods for Determining Extremum NumericalValues", filed Sep. 1, 2021.
U.S. Appl. No. 17/470,883 titled "Apparatuses and Methods for Tracking Victim Rows", filed Sep. 9, 2021.
International Application No. PCT/US20/23689, titled "Semiconductor Device Having Cam That Stores Address Signals", dated Mar. 19, 2020, pp. all.
U.S. Appl. No. 15/884,192 entitled 'Semiconductor Device Performing Row Hammer Refresh Operation', filed Jan. 30, 2018, pp. all.
U.S. Appl. No. 16/797,658, titles "Apparatuses and Methods for Controlling Refresh Operations", filed Feb. 21, 2020, pp. all.
U.S. Appl. No. 16/818,981 titled "Apparatuses and Methods for Staggered Timing of Targeted Refresh Operations", filed Mar. 13, 2020, pp. all.
U.S. Appl. No. 16/824,460, titled "Semiconductor Device Performing Row Hammer Refresh Operation", dated Mar. 19, 2020, pp. all.
U.S. Appl. No. 16/025,844, titled "Apparatus and Methods for Triggering Row Hammer Address Sampling", filed Jul. 2, 2018, pp. all.
U.S. Appl. No. 16/783,063, titled "Apparatus and Methods for Triggering Row Hammer Address Sampling", dated Feb. 5, 2020, pp. all.
U.S. Appl. No. 16/805,197, titled "Apparatuses and Methods for Calculating Row Hammer Refresh Addresses in a Semiconductor Device", dated Feb. 28, 2020, pp. all.
U.S. Appl. No. 16/232,837, titled "Apparatuses and Methods for Distributed Targeted Refresh Operations", filed Dec. 26, 2018, pp. all.
U.S. Appl. No. 16/818,989, titled "Semiconductor Device Performing Row Hammer Refresh Operation", dated Mar. 13, 2020, pp. all.
U.S. Appl. No. 16/268,818, titled "Apparatuses and Methods for Managing Row Access Counts", filed Feb. 6, 2019, pp. all.
U.S. Appl. No. 16/286,187 titled "Apparatuses and Methods for Memory Mat Refresh Sequencing", filed Feb. 26, 2019, pp. all.
U.S. Appl. No. 16/084,119, titled "Apparatuses and Methods for Pure-Time, Self Adopt Sampling for Row Hammer Refresh Sampling", filed Sep. 11, 2018, pp. all.
U.S. Appl. No. 16/886,284 titled "Apparatuses and Methods for Access Based Refresh Timing", filed May 28, 2020, pp. all.
U.S. Appl. No. 16/886,284, titled "Apparatuses and Methods for Access Based Refresh Timing", dated May 28, 2020, pp. all.
U.S. Appl. No. 16/358,587, titled "Semiconductor Device Having Cam That Stores Address Signals", dated Mar. 19, 2019, pp. all.
U.S. Appl. No. 16/375,716 titled "Apparatuses and Methods for Staggered Timing of Targeted Refresh Operations", filed Apr. 4, 2019; pp. all.
U.S. Appl. No. 16/936,297 titled "Apparatuses and Methods for Managing Row Access Counts", filed Jul. 22, 2020, pp. all.
U.S. Appl. No. 16/411,573 titled "Apparatuses, Systems, and Methods for a Content Addressable Memory Cell", filed May 14, 2019, pp. all.
U.S. Appl. No. 16/428,625 titled "Apparatuses and Methods for Tracking Victim Rows", filed May 31, 2019, pp. all.
U.S. Appl. No. 16/513,400 titled "Apparatuses and Methods for Tracking Row Accesses", filed Jul. 16, 2019, pp. all.
U.S. Appl. No. 17/060,403 titled "Apparatuses and Methods for Adjusting Victim Data", filed Oct. 1, 2020, pp. all.
U.S. Appl. No. 16/548,027 titled "Apparatuses, Systems, and Methods for Analog Row Access Rate Determination", filed Aug. 22, 2019, pp. all.
U.S. Appl. No. 16/549,942 titled "Apparatuses and Methods for Lossy Row Access Counting", filed Aug. 23, 2019, pp. all.
U.S. Appl. No. 16/546,152 titled "Apparatuses and Methods for Analog Row Access Tracking", filed Aug. 20, 2019, pp. all.
U.S. Appl. No. 16/549,411 titled "Apparatuses and Methods for Dynamic Refresh Allocation", filed Aug. 23, 2019, pp. all.
U.S. Appl. No. 16/655,110 titled "Apparatuses and Methods for Dynamic Targeted Refresh Steals", filed Oct. 16, 2019, pp. all.
International Application No. PCT/US19/40169 titled "Apparatus and Methods for Triggering Row Hammer Address Sampling" filed Jul. 1, 2019, pp. all.
International Application No. PCT/US19/64028, titled "Semiconductor Device Performing Row Hammer Refresh Operation", dated Dec. 2, 2019, pp. all.
International Application No. PCT/US20/26689, titled "Apparatuses and Methods for Staggered Timing of Targeted Refresh Operations", dated Apr. 3, 2020, pp. all.
International Application No. PCT/US20/40077, titled "Apparatuses and Methods for Monitoring Word Line Accesses", dated Jun. 29, 2020, pp. all.
U.S. Appl. No. 16/788,657, titled "Semiconductor Device Performing Row Hammer Refresh Operation", dated Feb. 12, 2020, pp. all.
U.S. Appl. No. 15/881,256 entitled 'Apparatuses and Methods for Detecting a Row Hammer Attack With a Bandpass Filter', filed Jan. 26, 2018, pp. all.
U.S. Appl. No. 16/425,525 titled "Apparatuses And Methods For Tracking All Row Accesses", filed May 29, 2019, pp. all.
U.S. Appl. No. 16/427,105 titled "Apparatuses And Methods For Priority Targeted Refresh Operations", filed May 30, 2019, pp. all.
U.S. Appl. No. 16/427,140 titled "Apparatuses And Methods For Tracking Row Access Counts Between Multiple Register Stacks", filed May 30, 2019, pp. all.
U.S. Appl. No. 16/437,811 titled "Apparatuses, Systems, And Methods For Determining Extremum Numerical Values", filed Jun. 11, 2019, pp. all.
U.S. Appl. No. 16/537,981 titled "Apparatuses and Methods for Controlling Targeted Refresh Rates", filed Aug. 12, 2019, pp. all.
U.S. Appl. No. 17/154,945 titled "Apparatuses, Systems, and Methods for a Content Addressable Memory Cell", filed Jan. 21, 2021, pp. all.
U.S. Appl. No. 17/168,036 titled "Apparatuses and Methods for Analog Row Access Tracking", filed Feb. 4, 2021, pp. all.
U.S. Appl. No. 17/170,616 titled "Apparatuses, Systems, and Methods for Analog Row Access Rate Determination", filed Feb. 8, 2021, pp. all.
U.S. Appl. No. 17/201,941 titled "Apparatuses and Methods for Sketch Circuits for Refresh Binning", filed Mar. 15, 2021, pp. all.
U.S. Appl. No. 17/301,533 titled "Semiconductor Device Having Cam That Stores Address Signals", filed Apr. 6, 2021, pp. all.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory", filed Oct. 27, 2017; pp. all.
U.S. Appl. No. 16/012,679, titled "Apparatuses and Methods for Multiple Row Hammer Refresh Address Sequences", filed Jun. 19, 2018, pp. all.
U.S. Appl. No. 16/020,863, titled "Semiconductor Device", filed Jun. 27, 2018, pp. all.
U.S. Appl. No. 16/112,471 titled "Apparatuses and Methods for Controlling Refresh Operations", filed Aug. 24, 2018, pp. all.
U.S. Appl. No. 16/160,801, titled "Apparatuses and Methods for Selective Row Refreshes", filed Oct. 15, 2018, pp. all.
U.S. Appl. No. 16/176,932, titled "Apparatuses and Methods for Access Based Refresh Timing", filed Oct. 31, 2018, pp. all.
U.S. Appl. No. 16/208,217, titled "Semiconductor Device Performing Row Hammer Refresh Operation", filed Dec. 3, 2018, pp. all.
U.S. Appl. No. 16/230,300, titled "Apparatuses and Methods for Staggered Timing of Targeted Refresh Operations", filed Dec. 21, 2018, pp. all.
U.S. Appl. No. 16/231,327 titled "Apparatuses and Methods for Selective Row Refreshes", filed Dec. 21, 2018, pp. all.
U.S. Appl. No. 16/237,291, titled "Apparatus and Methods for Refreshing Memory", filed Dec. 31, 2018, pp. all.
U.S. Appl. No. 16/290,730, titled "Semiconductor Device Performing Row Hammer Refresh Operation", filed Mar. 1, 2019, pp. all.
U.S. Appl. No. 16/374,623, titled "Semiconductor Device Performing Row Hammer Refresh Operation", filed Apr. 3, 2019, pp. all.

(56) References Cited

OTHER PUBLICATIONS

U.S. Appl. No. 16/411,698 title "Semiconductor Device", filed May 14, 2019, pp. all.
U.S. Appl. No. 16/427,330 titled "Apparatuses and Methods for Storing Victim Row Data", filed May 30, 2019, pp. all.
U.S. Appl. No. 16/431,641 titled "Apparatuses and Methods for Controlling Steal Rates", filed Jun. 4, 2019, pp. all.
U.S. Appl. No. 16/682,606, titled "Apparatuses And Methods For Distributing Row Hammer Refresh Events Across A Memory Device", filed Nov. 13, 2019, pp. all.
U.S. Appl. No. 17/102,266, titled "Apparatuses and Methods for Tracking Word Line Accesses", dated Nov. 23, 2020, pp. all.
U.S. Appl. No. 15/876,566 entitled 'Apparatuses and Methods For Calculating Row Hammer Refresh Addresses in a Semiconductor Device', filed Jan. 22, 2018, pp. all.
International Application No. PCT/US20/32684, titled "Apparatuses, Systems, and Methods for a Content Addressable Memory Cell", dated May 13, 2020, pp. all.
U.S. Appl. No. 15/656,084, titled: Apparatuses And Methods For Targeted Refreshing Of Memory, filed Jul. 21, 2017, pp. all.
U.S. Appl. No. 16/459,520 titled "Apparatuses and Methods for Monitoring Word Line Accesses", filed Jul. 1, 2019, pp. all.
PCT Application No. PCT/US18/55821 "Apparatus and Methods for Refreshing Memory" filed Oct. 15, 2018, pp. all.
U.S. Appl. No. 15/715,846, entitled "Semiconductor Device", filed Sep. 26, 2017, pp. all.
U.S. Appl. No. 15/888,993, entitled "Apparatuses and Methods for Controlling Refresh Operations", filed Feb. 5, 2018, pp. all.
U.S. Appl. No. 16/190,627 titled "Apparatuses and Methods for Targeted Refreshing of Memory", filed Nov. 14, 2018, pp. all.
U.S. Appl. No. 16/459,507 titled "Apparatuses and Methods for Adjusting Victim Data", filed Jul. 1, 2019, pp. all.
U.S. Appl. No. 15/281,818, entitled: "Semiconductor Device", filed Sep. 30, 2016, pp. all.
Kim, et al., "Flipping Bits in MemoryWithout Accessing Them: An Experimental Study of DRAM Disturbance Errors", IEEE, Jun. 2014, 12 pgs.
Stout, Thomas et al., "Voltage Source Based Voltage-to-Time Converter", IEEE, downloaded Jul. 2020, p. All.
U.S. Appl. No. 17/007,069 titled "Apparatuses and Methods for Providing Refresh Addresses", filed Aug. 31, 2020, pp. all.
U.S. Appl. No. 17/375,817 titled "Apparatuses and Methods for Monitoring Word Line Accesses", filed Jul. 14, 2021, pp. all.
U.S. Appl. No. 17/443,056 titled "Apparatuses and Methods for Multiple Row Hammer Refresh Address Sequences", filed Jul. 20, 2021, pp. all.
U.S. Appl. No. 17/456,849 titled "Apparatuses, Systems, and Methods for Main Sketch and Slim Sketch Circuitfor Row Address Tracking", filed Nov. 29, 2021.
U.S. Appl. No. 17/565,119 titled "Apparatuses and Methods for Row Hammer Counter Mat", filed Dec. 29, 2021.
U.S. Appl. No. 17/565,187 titled "Apparatuses and Methods for Row Hammer Counter Mat", filed Dec. 29, 2021.
U.S. Appl. No. 17/444,925 titled "Apparatuses and Methods for Countering Memory Attacks", filed Aug. 12, 2021.
Zheng, Bin , et al., "Design of Built-in DRAM for TFT-LCD Driver Chip "LCD and display," Issue 4", Aug. 15, 2009.

\* cited by examiner

610

| | | 0 | 1 | 2 | 3 | 4 | 5 |
|---|---|---|---|---|---|---|---|
| Weak_XADD0 | Hash0 | 0 | 0 | 0 | 0 | 1 | 0 |
| | Hash1 | 0 | 1 | 0 | 0 | 0 | 0 |
| | Hash2 | 1 | 0 | 0 | 0 | 0 | 0 |

620

| | | 0 | 1 | 2 | 3 | 4 | 5 |
|---|---|---|---|---|---|---|---|
| Weak_XADD1 | Hash0 | 0 | 0 | 1 | 0 | 1 | 0 |
| | Hash1 | 0 | 1 | 0 | 1 | 0 | 0 |
| | Hash2 | 1 | 0 | 0 | 0 | 0 | 0 |

630

| | | 0 | 1 | 2 | 3 | 4 | 5 |
|---|---|---|---|---|---|---|---|
| Weak_XADD2 | Hash0 | 0 | 0 | 1 | 1 | 1 | 0 |
| | Hash1 | 0 | 1 | 1 | 1 | 0 | 0 |
| | Hash2 | 1 | 0 | 0 | 0 | 0 | 1 |

FIG. 6

APPARATUSES AND METHODS FOR SKETCH CIRCUITS FOR REFRESH BINNING

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

Different memory cells may lose information at different rates (e.g., different rates of memory decay). To preserve information, the rate at which memory cells are refreshed may be based on the rate of the memory cells with the fastest anticipated information decay. However, this may be inefficient, as some memory cells may be over refreshed, and the memory may spend time refreshing which is not necessary, and which could have been spend performing other functions.

BRIEF DESCRIPTION OF THE DRAWINGS

FIG. 6 is a set of table showing a process of writing entries to a storage structure according to some embodiments of the present disclosure.

DETAILED DESCRIPTION

Figure 1:
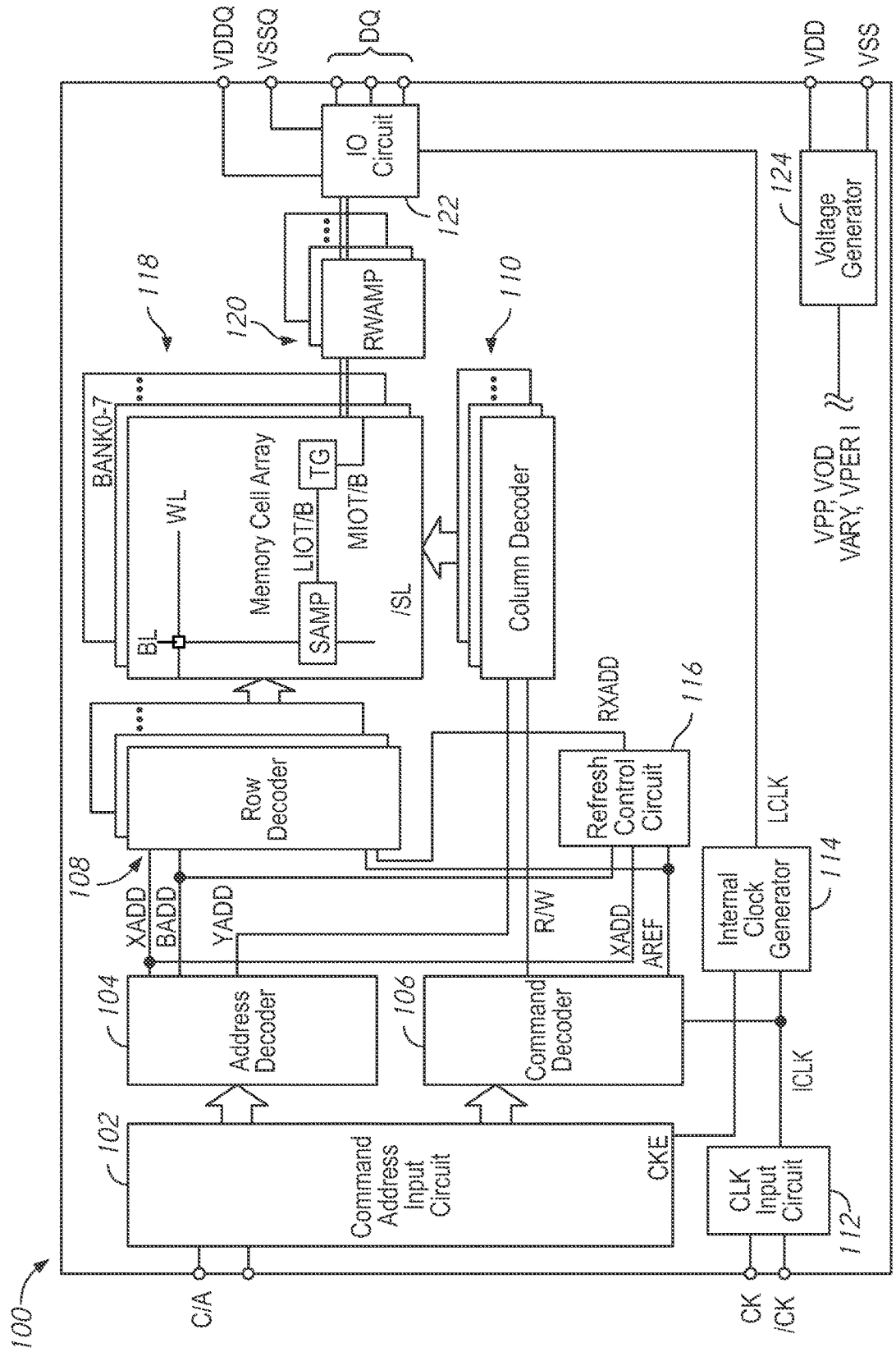
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (wordlines) and columns (bit lines), in each bank of a memory array. The memory cells may be refreshed on a row-by-row basis. In order to prevent information from being lost or corrupted due to this decay, the memory may carry out a background refresh process, such as auto-refresh operations as part of a self-refresh mode. During a refresh operation, information may be rewritten to memory cells associated with the wordline to restore their initial states. The auto-refresh operations may be performed on the wordlines of the memory in a sequence.

The rate at which the refresh operations are performed may be chosen to prevent the loss of information, ideally such that each memory cell is refreshed before the information stored in that memory cell is lost. Different memory cells (e.g., different rows of memory) may lose information at different rates. For example some rows (due to variances in manufacturing, variances in location on the chip, etc.) may decay faster than others. It may be useful to group rows together (e.g., binning) into groups based on the expected rate of data decay such that different groups may be refreshed at different rates. For example a bin of identified 'weak' rows with a high rate of information decay may be refreshed more frequently than a bin of identified 'normal' rows with a lower rate of information decay. However it may be inefficient if information about binning is stored separately for each row of the memory. It may be desirable to use data structures which allow for more efficient recording of which rows belong to which bins.

The present disclosure is drawn to sketch circuits for refresh binning. A sketch circuit represents a data structure which may be useful for recording information in a manner which does not require a separate storage space for each row. A sketch circuit includes a storage structure which includes a table of entries each of which are indexed by a hash function and a value output by that hash function. For example, a first hash generator (which uses a first hash operation) may provide a first value based on an address, which may be associated with a first entry in the table indexed by the first value and the first hash function. A second hash generator (which uses a second hash operation) may provide a second value based on the address, which may be associated with a second entry and so forth. Since each hash function may include collisions (e.g., each hash value may be associated with several row addresses), each row of entries (e.g., each set of entries associated with a given hash function) may contain many fewer entries than there are row addresses. The use of multiple 'rows' (e.g., multiple hash functions) may help preserve information despite the number of collisions on a given row.

In an example refresh operation using a refresh circuit, a refresh address generator may generate an address as part of a refresh operation (e.g., by using a counter to generate a sequence of addresses). It may provide the address to multiple hash generators, each of which may generate a hash value associated with that address. Each value (and hash circuit) may be used to index an entry in the storage structure. Accordingly a number of entries (one for each hash circuit) may be retrieved. The values of these entries may be used to determine which refresh bin the address belongs to. For example there may be two bins (normal and weak rows) and each entry in the storage structure may be a binary bit, with a logical high representing a weak row and a logical low representing a normal row. The row may be judged to be a weak row if any of the entries retrieved from the storage structure is a logical high. A refresh control circuit may refresh weak rows more frequently than normal rows. For example, the refresh control circuit may cycle through all memory addresses as part of a refresh cycle, and on every other cycle, may only refresh rows identified as weak rows.

Although collisions between different row addresses in the hash circuits may cause rows to be falsely identified as belonging to a 'weak' bin, the use of a sketch circuit may tend to overestimate the number of rows in a 'weak' bin, which may be safer than a structure which allows for false negatives. The use of binning may also allow for increased performance, as the rate at which 'normal' rows are refreshed may be lower than in a conventional memory where the refresh rate is set based on the rate needed for the weakest rows. This may free up bandwidth for the memory to perform other tasks and reduce the power consumption of the memory.

The storage structure may be loaded with information indicating which rows belong to which refresh groups. For example, the memory may be tested and weak rows may be identified. The weak row addresses may be fed into the hash generators and those values may be used to index the entries in the storage structure. In some embodiments, the storage structure may include non-volatile memory elements (e.g., fuses, anti-fuses, etc.). Accordingly, the entries associated with the identified weak row may be changed (e.g., the fuses may be blown). In some embodiments, this testing and setting of the storage structure may be done in a factory. In some embodiments, the memory may be able to perform post-package repair (PPR) to change the entries in the field. In some embodiments, a controller may include the storage structure and may dynamically alter the entries based on error detection. This may allow the controller to adjust the rates at which different word lines are refreshed dynamically.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122.

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read write amplifiers 120, and by the read/write amplifiers 120 to the memory array 118 to be written into the memory cell MC.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and may cause the device 100 to return to an idle state and/or resume other operations.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of wordlines represented by the address), or may operate based on internal logic.

The refresh control circuit 116 may selectively output a targeted refresh address (e.g., which specifies one or more victim address based on an aggressor) or an automatic refresh address (e.g., from a sequence of auto-refresh addresses) as the refresh address RXADD. Based on the type of refresh address RXADD (and in some embodiments, one more additional signals indicating the type of operation), the row decoder 108 may perform a targeted refresh or auto-refresh operation. The automatic refresh addresses may be from a sequence of addresses which are provided based on activations of the refresh signal AREF. For example, a counter may be used to increment or otherwise 'count through' possible row address values for RXADD. The refresh control circuit 116 may cycle through the sequence of auto-refresh addresses at a rate determined by AREF. A refresh cycle may represent the auto-refresh address generator refreshing each row of the memory (e.g., providing each value of the auto-refresh address). In some embodiments, the auto-refresh operations may generally occur with a timing such that the sequence of auto-refresh addresses is cycled such that no information is expected to degrade in the time between auto-refresh operations for a given wordline. In other words, auto-refresh operations may be performed such that each wordline is refreshed at a rate faster than the expected rate of information decay.

Different row addresses of the memory array 118 may have different rates of data decay. Accordingly, some word lines may need to be refreshed more frequently than other word lines to preserve their information. The different word lines may be sorted into different groups or bins, based on their performance characteristics (e.g., the rate of information decay). For example, a first bin may include word lines which have been identified as 'weak' (e.g., they have an information decay time below a certain threshold) while a second bin may include a remainder of the word lines (e.g., a 'normal' bin). More bins may be used in other examples. While performing auto-refresh operations, the auto-refresh address may be checked to see what bin the word line associated with that address belongs to, and the rate at which that word line is refreshed may be determined based on the bin. For example, during every other refresh cycle (e.g., cycling through all possible values of the auto-refresh address) only the auto-refresh addresses identified as part of the 'weak' bin may be provided as the refresh address RXADD. Other patterns of varying the rates of refresh operations between bins are possible in other embodiments. As described in more detail herein, the memory device 100 may store the binning information in a sketch circuit.

Since the refresh control circuit 116 stores information binning the rows into groups based on their expected rate of information decay, the refresh rate for each bin may be set based on the fasted expected rate of information loss in that group. Accordingly, this may allow rows which are grouped in 'stronger' (e.g., normal) bins to be refreshed less often than the weak rows. Since it may generally be expected that there are many more 'normal' rows than 'weak' rows, this may reduce the overall rate of refresh operations in the memory device 100. This, in turn, may improve the performance of the memory 100, for example by reducing the power consumption used to refresh the memory 100 and/or by increasing bandwidth by freeing up more time for the memory 100 to perform non-refresh operations.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. The refresh control circuit 116 may use one or more signals of the device 100 to calculate the targeted refresh address RXADD. For example, the refresh address RXADD may be a calculated based on the row addresses XADD provided by the address decoder.

In some embodiments, the refresh control circuit 116 may sample the current value of the row address XADD provided by the address decoder 104 along a row address bus, and determine a targeted refresh address based on one or more of the sampled addresses. The sampled addresses may be stored in a data storage unit of the refresh control circuit. When a row address XADD is sampled, it may be compared to the stored addresses in the data storage unit. In some embodiments, the aggressor address may be determined based on the sampled and/or stored addresses. For example, the comparison between the sampled address and the stored addresses may be used to update a count value (e.g., an access count) associated with the stored addresses and the aggressor address may be calculated based on the count values. The refresh addresses RXADD may then be used based on the aggressor addresses.

While in general the present disclosure refers to determining aggressor and victim wordlines and addresses, it should be understood that as used herein, an aggressor wordline does not necessarily need to cause data degradation in neighboring wordlines, and a victim wordline does not necessarily need to be subject to such degradation. The refresh control circuit 116 may use some criteria to judge whether an address is an aggressor address, which may capture potential aggressor addresses rather than definitively determining which addresses are causing data degradation in nearby victims. For example, the refresh control circuit 116 may determine potential aggressor addresses based on a pattern of accesses to the addresses and this criteria may include some addresses which are not aggressors, and miss some addresses which are. Similarly, victim addresses may be determined based on which wordlines are expected to be effected by aggressors, rather than a definitive determination of which wordlines are undergoing an increased rate of data decay.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
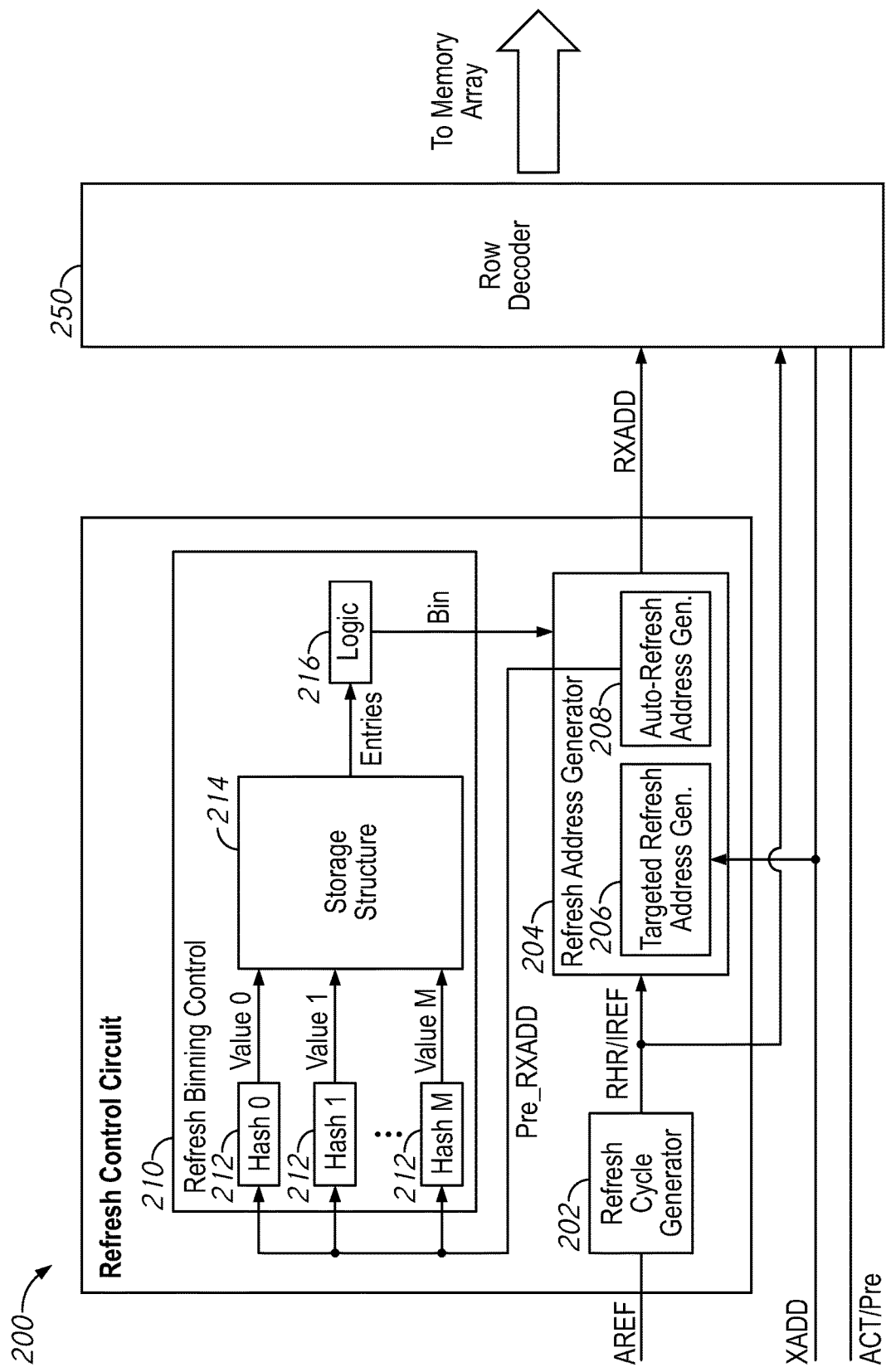
FIG. 2 is a block diagram of a refresh control circuit according to some embodiments of the present disclosure.

FIG. 2 is a block diagram of a refresh control circuit according to some embodiments of the present disclosure. The refresh control circuit 200 may, in some embodiments, be included in the refresh control circuit 116 of FIG. 1. The refresh control circuit 200 receives a refresh signal AREF which controls the timing at which the refresh control circuit 200 provides a refresh address RXADD. Also shown in FIG. 2 is a row decoder 250 (e.g., row decoder 108 of FIG. 1) which may refresh one or more wordlines of a memory array based on the refresh address RXADD.

The refresh control circuit 200 includes a refresh cycle generator 202, which receives the refresh signal AREF and determines the timing of refresh operations based the refresh signal AREF. The refresh control circuit 202 also determines if an auto-refresh operation or a targeted refresh operation should be performed and provides signals such as a targeted refresh signal RHR and an internal refresh signal IREF which indicate what type of refresh operation should be performed. The refresh control circuit 204 includes a refresh address generator 204, which generates a refresh address RXADD based, in part on the signals received from the refresh cycle generator 202. During a targeted refresh operation, a targeted refresh address generator 206 of the refresh address generator 204 may provide a targeted refresh address as RXADD. During an auto-refresh operation, an auto-refresh generator 208 of the refresh address generator 204 may generate an auto-refresh address Pre_RXADD and provide it to a refresh binning circuit 210, which may indicate which bin the auto-refresh address Pre_RXADD is part of. Based on that information, the refresh address generator 204 may determine whether to provide the auto-refresh address Pre_RXADD as the refresh address RXADD or not.

The refresh cycle generator 202 may receive the refresh signal AREF and may provide internal refresh signals IREF and/or RHR with timing based on the refresh signal AREF. The signals IREF and RHR may be used to indicate which type of refresh operation should be performed. For example in some embodiments IREF being active but RHR being inactive may indicate an auto-refresh operation, while both IREF and RHR being active may indicate a targeted refresh operation. Other patterns of signals may be used in other embodiments. Responsive to an activation of the refresh signal AREF, the refresh cycle generator 202 may indicate that one or more refresh operations should be performed. In some embodiments, responsive to a single activation of AREF, the refresh cycle generator 202 may perform a number of 'pumps' each associated with a refresh operation. In an example operation, when AREF is activated, the refresh cycle generator 202 may perform 2, 4, 6, or 8 pumps, each associated with a refresh operation. More or fewer refresh operations per activation of AREF may also be used. The refresh cycle generator 202 may use internal logic to determine whether each refresh operation should be a targeted refresh operation or an auto-refresh operation.

The refresh address generator 204 may include circuits for generating the refresh address RXADD when a targeted refresh operation is called for (e.g., when both IREF and RHR are active). The targeted refresh address generator 206 may generate targeted refresh addresses and provide them as RXADD. For example the targeted address generator 206 may track aggressor word lines, and may provide addresses associated with the victim word lines of those aggressor word lines as the refresh address RXADD. For example, the refresh address may represent word lines which are adjacent to the aggressor (e.g., R+1 and R−1). Other relationships (e.g., R+/−2, R+/−3, etc.) may also be used.

The refresh address generator 204 may include an auto-refresh address generator 208 which may provide an auto-refresh address Pre_RXADD as the refresh address responsive to an auto-refresh operation (e.g., IREF being active and RHR being inactive). The auto-refresh address may generated from a sequence of refresh addresses. For example, a counter may be used to count through the values of Pre_RXADD so that over the course of a refresh cycle, all word lines are refreshed. In some embodiments, the auto-refresh address Pre_RXADD may be associated with more than one word line. For example, the auto-refresh address may be truncated compared to a normal row address (e.g., XADD in FIG. 1) and may be associated with every word line which shares that truncated portion in common. The auto-refresh address Pre-RXADD may be provided to a refresh binning circuit 210 to determine which bin(s) the auto-refresh address Pre_RXADD belongs to. The refresh address generator 204 may then determine whether or not to provide the address Pre_RXADD as the refresh address RXADD based, in part, on the binning information.

The refresh binning control circuit 210 uses a sketch data structure to store information about which rows are part of which refresh bins. The refresh binning circuit 210 uses a data storage structure 214 which stores a table of values which indicate if a given row is in a particular bin or not. As explained in more detail with respect to FIG. 3, the table may have entries organized in rows indexed by a hash function, and columns indexed by the values that the hash functions can output. It should be understood that reference to the organization of the entries in terms of rows and columns refers to ways in which the organization of the entries may be conceptualized. The entries may be physically organized in any manner.

The refresh binning control circuit 210 includes a number of hash circuits 212. Each hash circuits 212 (Hash0 to HashM) may receive the auto-refresh address Pre-RXADD in common and provide a respective value Value0 to ValueM. The hash circuits 212 may receive the address Pre_RXADD as an input value and provide the respective value based on the address Pre_RXADD. The address Pre_RXADD may have a first number of bits (e.g., 17 bits). The value may have a second number of bits which is smaller than the first number. Accordingly, there may be fewer total possible states of the value than there are states of the address Pre_RXADD. There may thus be collisions between input states (e.g., values of Pre_RXADD) and output states (e.g., values of Value) provided by each hash circuit 212. For example, each state of Value may represent 8, 16, 32, or some other number of possible values of Pre_RXADD. In some embodiment, each of the values output by the hash circuits 212 may have the same number of bits. If there are N total possible values each hash circuit 212 can provide, and there are M total hash circuits 212, then the storage structure 214 may hold N×M total entries.

Each of the refresh circuits 212 may hash the input value (e.g., Pre_RXADD) differently by implementing a different hash operation. In some embodiments, that may be due to each hash circuit 210 implementing a different hash function. In some embodiments, the differences may be due to different seed values input to each of the hash circuits 212. For example, each hash circuit 212 may have the same hash function, but may be seeded differently. In some embodiments, a mix of different hash functions and seeds may be used to vary the hash operations between the hash circuits 212.

The entries associated with (e.g., indexed by) the provided values Value0 to ValueM (and the hash circuits which provided those values) may be retrieved and provided to a logic circuit 216. The logic circuits 216 may use the entries to determine which bin the provided address Pre_RXADD belongs to and may provide a signal Bin to the refresh address generator 204. In some embodiments, there may be only two bins (e.g., normal and weak rows) and the bin signal Bin may be a binary signal. In some embodiments, the bin signal may have more states (e.g., more bits) to indicate more bins.

In some embodiments, the storage structure 214 may represent non-volatile storage. For example, the storage structure 214 may include non-volatile storage elements such as fuses or anti-fuses. In some embodiments, the entries in the storage structure 214 may be set as part of a testing procedure (e.g., in a factory). In some embodiments, the memory may be capable of changing entries in storage structure 214 as part of a post package repair (PPR) operation. For example if a row is determined to be weak in the field, a PPR operation may be used to change one or more entries in the storage structure 214. The loading of entries in the storage structure is discussed in more detail in FIGS. 5-7.

In an example embodiment, there may be two bins, and the refresh address generator 204 may refresh the addresses in the weak bin twice as often as the addresses in the normal bin. For example on a first refresh cycle, the bin information may be ignored and all addresses Pre_RXADD may be refreshed. After completing the first refresh cycle, a flag may be set. While the flag is set, during a second refresh cycle, the address Pre_RXADD may only be provided as RXADD and refreshed if the signal Bin indicates that the address Pre_RXADD is a weak row. At the end of the second refresh cycle, the flag may be unset, and the behavior of the first refresh cycle may be repeated. In this manner the refresh control circuit 200 may alternate between refreshing every row and only refreshing rows in the weak bin on each refresh cycle.

In some embodiments, the refresh control circuit 200 may include two auto-refresh address generators. The different auto-refresh generators may each generate addresses in a manner similar to auto-refresh address generator 208. The first auto-refresh address generator may provide its address as the refresh address when the bin signal is active, while the second auto-refresh address generator may provide its address as the refresh address when the bin signal is inactive. The refresh cycle generator may operate the two auto-refresh address generators at different rates (e.g., using internal signals) to refresh the weak row addresses and non-weak row addresses at different rates. If more than two bins are used (e.g., the Bin signal has more than two states) additional auto-refresh address generators may be provided, for example, one for each state of the signal Bin.

Figures 3, 4:
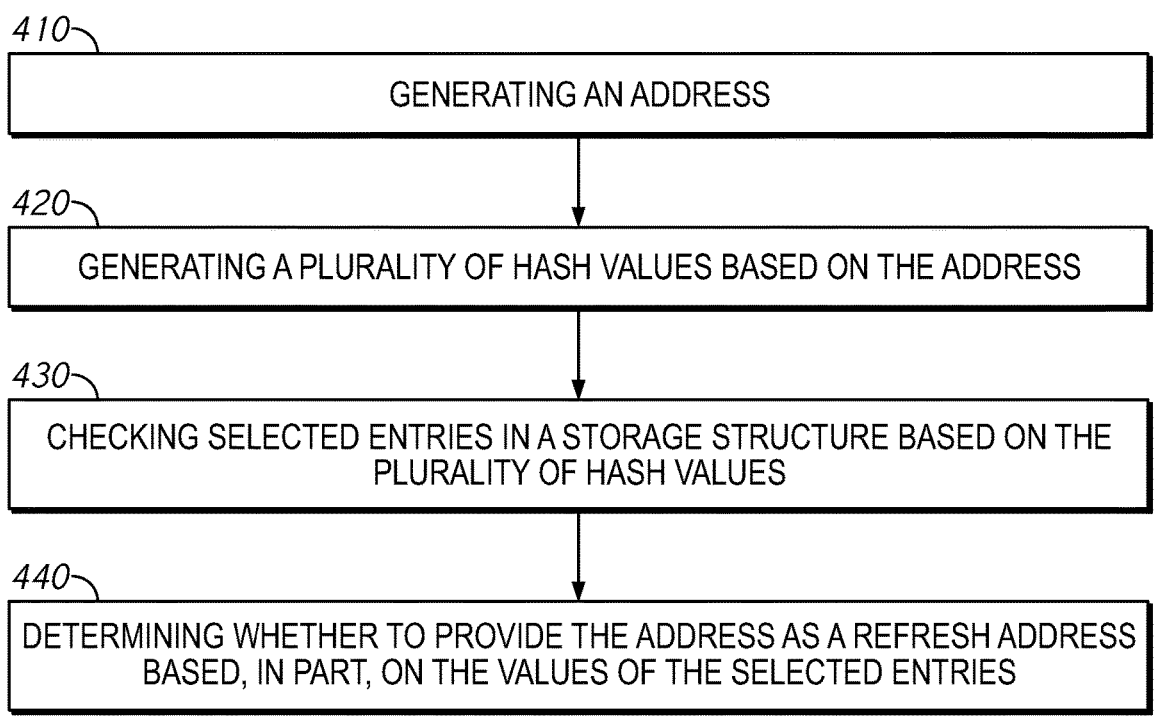
FIG. 3 is a table of an example storage structure according to some embodiments of the present disclosure.
FIG. 4 is a flow chart of an example method according to some embodiments of the present disclosure.

FIG. 3 is a table of an example storage structure according to some embodiments of the present disclosure. The table 300 may, in some embodiment, represent the logical organization of the storage structure 214. The table 300 may represent a simplified example with three hash functions (Hash0 to Hash2) each of which may generate a value with 6 possible values (e.g., 0 to 5).

The table 300 shows an example situation where an address (e.g., Pre-RXADD) has been provided and hashed into 3 values by each of 3 hash circuits, Hash0, Hash1, and Hash2. Each hash circuit has independently generated a value which in this case is different for each of the hash circuits. So Hash0 has provided a value of 4, Hash1 has provided a value of 1 and Hash2 and provided a value of 0. As indicated by the shaded entries in the table 300, each hash value and its output may be used to index an entry of the table 300. Accordingly, the entries retrieved in this example would 1, 0, and 1.

The example embodiment of FIG. 3 shows an embodiment where the stored entries are binary to represent two possible bins (e.g., weak and normal). In the example, there is disagreement among the retrieved entries (1, 0, and 1) about which bin the input address belongs to. A logic circuit (e.g., 216 of FIG. 2) may judge which bin the address belongs to based on the retrieved entries. For example the logic circuit may set the bin signal Bin at a high logical level (e.g., indicating the weak bin) if any of the retrieved entries are a logical high. So in the case illustrated by the shaded entries, the overall bin signal would be active.

To consider another example, a second address may cause Hash0 to provide a value of 2, Hash1 may provide a value 1 (indicating a collision between the first and second address in the hash circuit Hash1), and Hash2 may provide a value 2. Since all of these entries are 0, the overall bin signal may be 0, indicating a normal row.

FIG. 4 is a flow chart of an example method according to some embodiments of the present disclosure. The method 400 may, in some embodiments, be implemented by one or more of the apparatuses or system described herein. The method 400 may generally represent a process for determining what bin an auto-refresh belongs to.

The method 400 may generally begin with box 410 which describes generating an address. The address may be an auto-refresh address (e.g., Pre_RXADD of FIG. 2). The address may be generated by an address generator as part of a sequence of auto-refresh addresses. For example as part of a refresh cycle the method may include generating a first address as part of a first refresh operation, generating a second address as part of a second refresh operation and so forth until generating final address (e.g., a last address in a sequence that includes addresses which cover all word lines of the memory). On a next refresh operation the first address may be generated again as part of a second refresh cycle. The steps described in boxes 420-440 may be performed for each address generated.

Box 410 may generally be followed by box 420, which describes generating a plurality of hash values based on the address. The method 400 may include providing the generated address in common to each of a plurality of hash circuits. The method 400 may include performing, with each of the hash circuits, a different hash operation on the address and providing a respective one of the plurality of hash values based on the hashed address.

Box 420 may generally be followed by box 430 which describes checking selected entries in a data storage structure based on the plurality of hash values. The data storage structure may include entries logically organized in a table indexed by hash function and hash value. Box 420 may include reading each of the selected entries by indexing each of the plurality of hash values and the hash circuit associated with that hash value.

Box 430 may generally be followed by box 440, which describes determining whether to provide the address as a refresh address based, in part, on the values of the selected entries. For example box 430 may include comparing the selected entries read from the data storage structure (e.g., with logic circuit 216) to determine if any of the selected entries indicate that the address is associated with a weak row (e.g., any of the selected entries are a high logical level), and providing a bin signal at an active level if so. A refresh control circuit (e.g., 116 of FIG. 1 and/or 200 of FIG. 2) may determine whether to provide the address as the refresh address based on the bin signal. For example, the method 400 may include alternating between providing the address as the refresh address if the bin signal is at the active level during a first refresh cycle and providing the address as the refresh address regardless of the big signal during a second refresh cycle.

Figure 5:
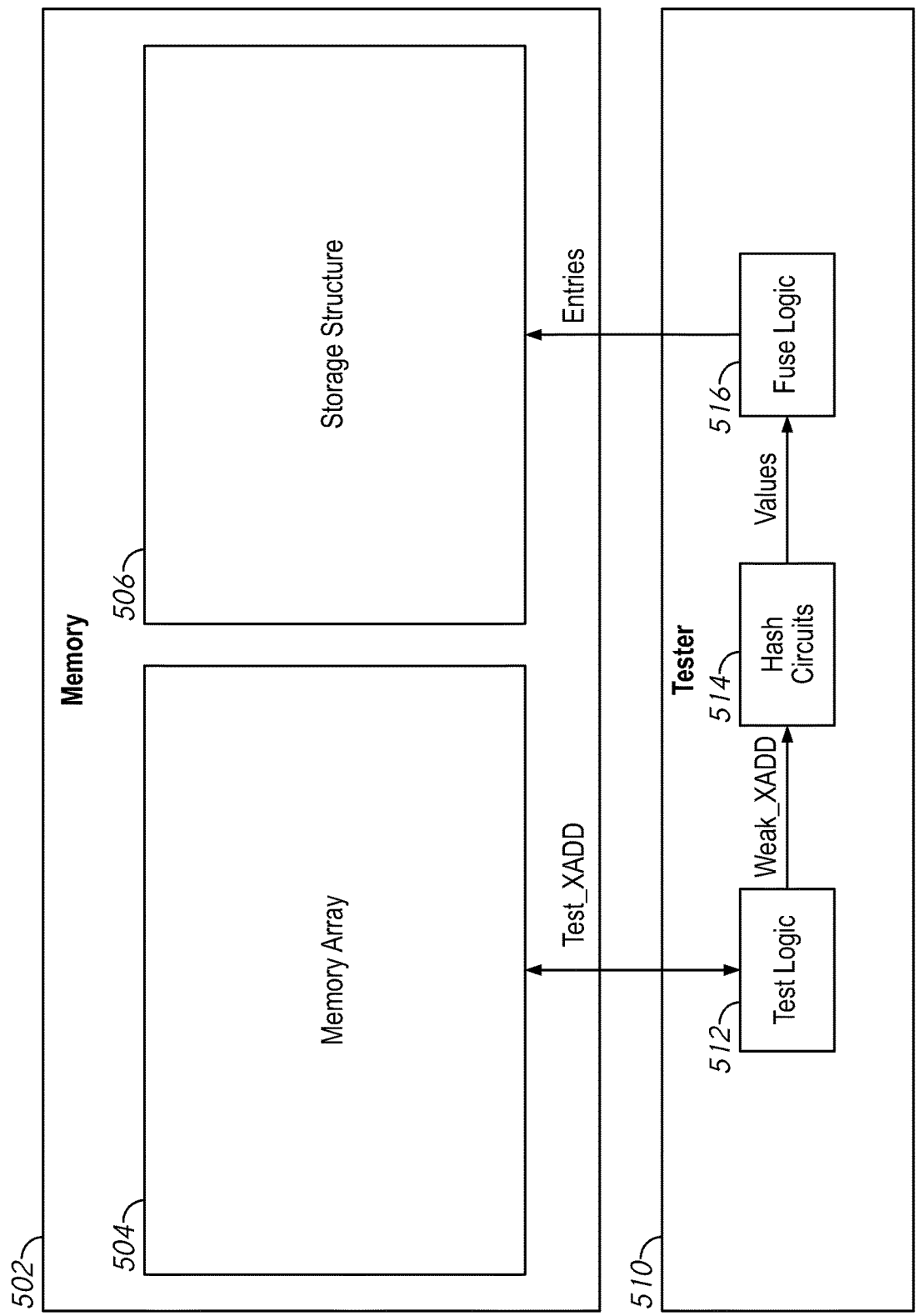
FIG. 5 is a block diagram of a memory and a memory tester according to some embodiments of the present disclosure.
Figure 7:
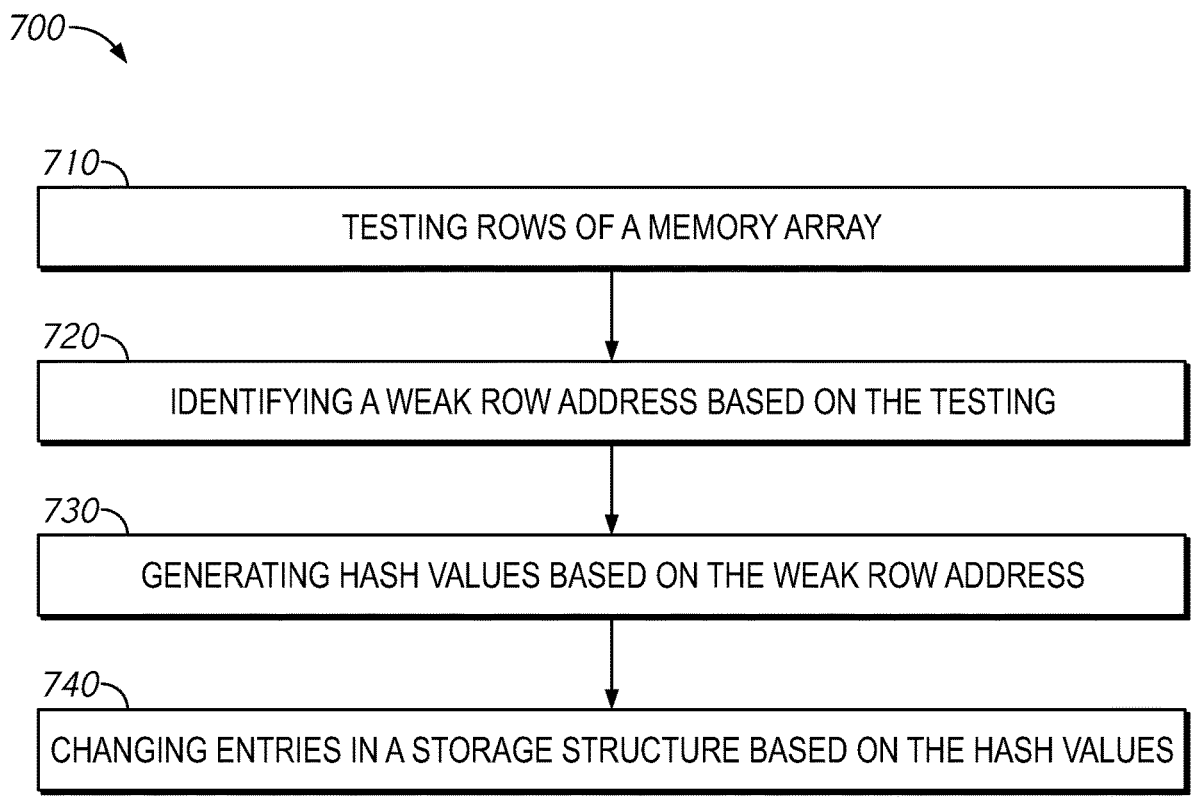
FIG. 7 is a flow chart of an example method according to some embodiments of the present disclosure.

FIGS. 5-7 discuss an example apparatus and process for loading information into a data storage structure (e.g., 214 of FIG. 2). FIGS. 5-7 are generally described in terms of an external tester coupled to the memory during an initial testing process (e.g., in a factory, during packaging, etc.) where certain operations are performed in the tester and certain operations are performed by the memory. However it should be understood that various functions and circuits may be arranged different between the tester and memory in other example embodiments. For example, rather than an external tester, the memory may include built-in test circuits which may perform similar functions to the tester without the need for an external tester. Similarly, while FIGS. 5-7 are described with respect to particular criteria for loading information into the data storage structure and determining which addresses belong to which bins, different binning systems and criteria for determining which row goes in which bin may be used in other example embodiments.

FIG. 5 is a block diagram of a memory and a memory tester according to some embodiments of the present disclosure. The memory 502 may, in some embodiments, represent the memory device 100 of FIG. 1. FIG. 5 shows a tester 510 coupled to the memory 502. The tester 510 may test the retention time of rows of the memory and determine which bin a given row should be assigned to. The tester 510 may store this information on the memory 502 by writing the information to a storage structure 506 of the memory 502 (e.g., by changing the states of one or more non-volatile storage elements).

The memory 502 includes a memory array 504 (e.g., 118 of FIG. 1) and a storage structure 506 (e.g., 214 of FIG. 2). The storage structure 506 may include non-volatile storage elements, such as fuses and/or anti-fuses. In some embodiments, the storage structure 506 may be a fuse array of the memory 502.

The tester 510 may be an external apparatus which is coupled to the memory 502 in order to perform various tests on the memory 502. For example, the tester may locate defective rows, measure the retention time (e.g., rate of information decay) of rows, perform various other tests and combinations thereof. For the sake of brevity, the tester 510 will only be discussed in terms of testing the retention time of rows for the sake of determining which refresh bin to put the row in. It should be understood that the tester may perform any number of tests, and may include additional components not shown in FIG. 5.

In the example view of FIG. 5, the tester 510 includes test logic 512 which may be used to measure the information retention time of one or more rows of the memory array 504. Based on the measured retention time, the test logic may categorize the tested row address Test_XADD as normal or as a weak address Weak_XADD. The identified weak row addresses Weak_XADD may be provided to one or more hash circuits 514, which may determine which entries in the storage structure to change. The entries may then be written to the storage structure 506, in this case by a fuse logic circuit 516, which may change the state of fuses (and/or anti-fuses) in the storage structure 506 based on the entries provided by the hash circuit 514. In embodiments where fuses/anti-fuses are not used as part of the storage structure 506, different methods may be used of writing the entries to the storage structure 506 and the fuse logic 516 may be omitted.

The test logic 512 may perform one or more test procedures to measure a retention time of a given row, in order to determine how quickly information is lost in that row. For example, the test logic 512 may write test data to a row specified by the address Test_XADD, wait a period of time, and then read the test data from that row. The read test data may be compared to the written test data to determine if there are any differences. If there is a difference, then the test logic 512 may determine that the tested row Test_XADD failed to retain the data for at least the period of time. In some embodiments, the test logic 512 may repeat this process for different lengths of time and determine the maximum tested amount of time the row holds information for. Based on that length of time, the row may be judged to be a weak row or not. In some embodiments, the test logic 512 may test a single length of time and determine if a row is a weak row or normal row based on if the read information has any errors or not.

The hash circuits 514 may receive identified weak rows Weak_XADD from the test logic 512. The hash circuits 514 may match the operation of the hash circuits in the memory (e.g., hash circuits 212 of FIG. 2). In some embodiments, the tester 510 may use the hash circuits on the memory 502, and the hash circuits 514 may be omitted. The hash circuits 514 may include a number of hash circuits, each of which may generate a hash value based on the input address Weak_XADD.

The hash values generated by the hash circuits 514 may be provided to the fuse logic circuit 516, which may write those values to the storage structure 506. For example, the fuse logic 516 may blow fuses (and/or anti-fuses) in the storage structure 506 to set the value of the entry to a location indexed by the hash circuit and value. FIG. 6 describes an example process for writing the values to the storage structure 506 in more detail.

In some embodiments, rather than an external tester 510, the memory 502 may use internal test logic (e.g., a built-in test circuit or BIST). The internal test logic may perform a test and determine that one or more rows are weak (e.g., fail a criterion for memory retention). The memory 502 may then carry out a post-package operation (similar to a post-package repair or PPR operation) to change the state of one or more entries in the storage structure 506. In this manner, weak rows which are identified in the field (or which become weak after factory testing) may have their binning information added to the storage structure 506.

FIG. 6 is a set of table showing a process of writing entries to a storage structure according to some embodiments of the present disclosure. In some embodiments, the tables 610 to 630 may represent entries being written to a storage structure (e.g., 506 of FIG. 5) by a tester (e.g., fuse logic circuit 516 of FIG. 5). The tables 610 to 630 may be generally similar to the table 300 of FIG. 3 and so for the sake of brevity, details explained with respect to FIG. 3 will not be repeated with respect to FIG. 6.

Table 610 shows the entries for a first identified weak address Weak_XADD0 being written to storage structure. In this example, as represented by the shaded entries, the first hash value is 4, the second hash value is 1 and the third hash value is 0. Accordingly, the entries indexed by these values may be changed. In this case, a fuse indexed by the value and hash function may be blown (e.g., as indicated by a value of 1) to indicate that those entries are associated with a weak row (e.g., Weak_XADD0).

Table 620 shows a second identified weak address Weak_XADD1, which has a first hash value of 2, a second hash value of 3 and a third hash value of 0. The entries indexed by Hash0 and a value of 2 and indexed by Hash1 and Value 3 may both be changed (e.g., blown). In this case there is collision in the third hash function between the first address Weak_XADD0 and second address Weak_XADD1 (e.g., they both yield values of 0). Since this entry was already changed, it may be maintained.

Table 630 shows a third identified weak address Weak_XADD2 which has a first hash value of 3, a second hash value of 2, and a third hash value of 5. These entries may be changed. Note that even though the 3 addresses have been loaded into the storage structure, due to collisions, there are not necessarily 3 changed entries on each row.

FIG. 7 is a flow chart of an example method according to some embodiments of the present disclosure. The method 700 may represent a method of loading information into a storage structure (e.g., 214 of FIG. 2 and/or 506 of FIG. 5). The method 700 may, in some embodiments be performed by one or more of the apparatuses or systems described herein.

The method 700 may generally begin with box 710, which describes testing rows of a, memory array. The testing may include measuring an information retention time of the rows. In some embodiments, rather than perform a specific testing operation, the box 710 may include detecting errors in information read from the memory.

Box 710 may generally be followed by box 720, which describes identifying a weak row address based on the testing. The weak row address may be associated with a weak word line. The weak row address may be identified based on a measure of the information retention time exceeding a threshold.

Box 720 may generally be followed by box 730, which describes generating hash values based on the weak row address. For example, the weak row address may be provided to a set of hash circuits, each of which may perform a different hash operation on the weak row address. The hash operations may be different hash functions, receive different seeds, or combinations thereof. The hash operations may match hash operations on the memory, which are used to retrieve information (e.g., the hash circuits 212 of FIG. 2).

Box 730 may generally be followed by box 740, which describes changing entries in a storage structure based on the hash values. For example, the entries may be part of table which is indexed by the different hash operations (e.g., the different hash circuits) and by the hash value generated by that hash operation. In some embodiments, the entries may be stored using non-volatile storage elements. In some embodiments, the entries may be binary, and the entry may be set to an active level (or maintained at an active level) if the hash values associated with the weak row address indicate that entry.

In some embodiments, the steps of the method 700 may be performed by a tester which is external to the memory device. For example the method 700 may be performed as part of testing of the memory device in a factory. In some embodiments the steps of the method 700 may be performed by the memory itself. For example, a built-in self-test circuit may perform the testing and a process similar to a post-package repair may be used to change the entries in the storage structure.

In some embodiments, the steps of method 700 may be performed by a controller which operates a memory device. The controller may test the memory as part of a specific test operation and/or may test the memory by monitoring error detection circuits. For example, if an error is detected in data read from a particular row, it may indicate that row is a weak row. The controller may then update the storage structure, which may be located on the controller. The storage structure may include volatile storage elements, and may be dynamically updated over time. In this manner, the method 700 may include dynamically assigning rows to different bins by writing entries to the storage structure.

Figure 8:
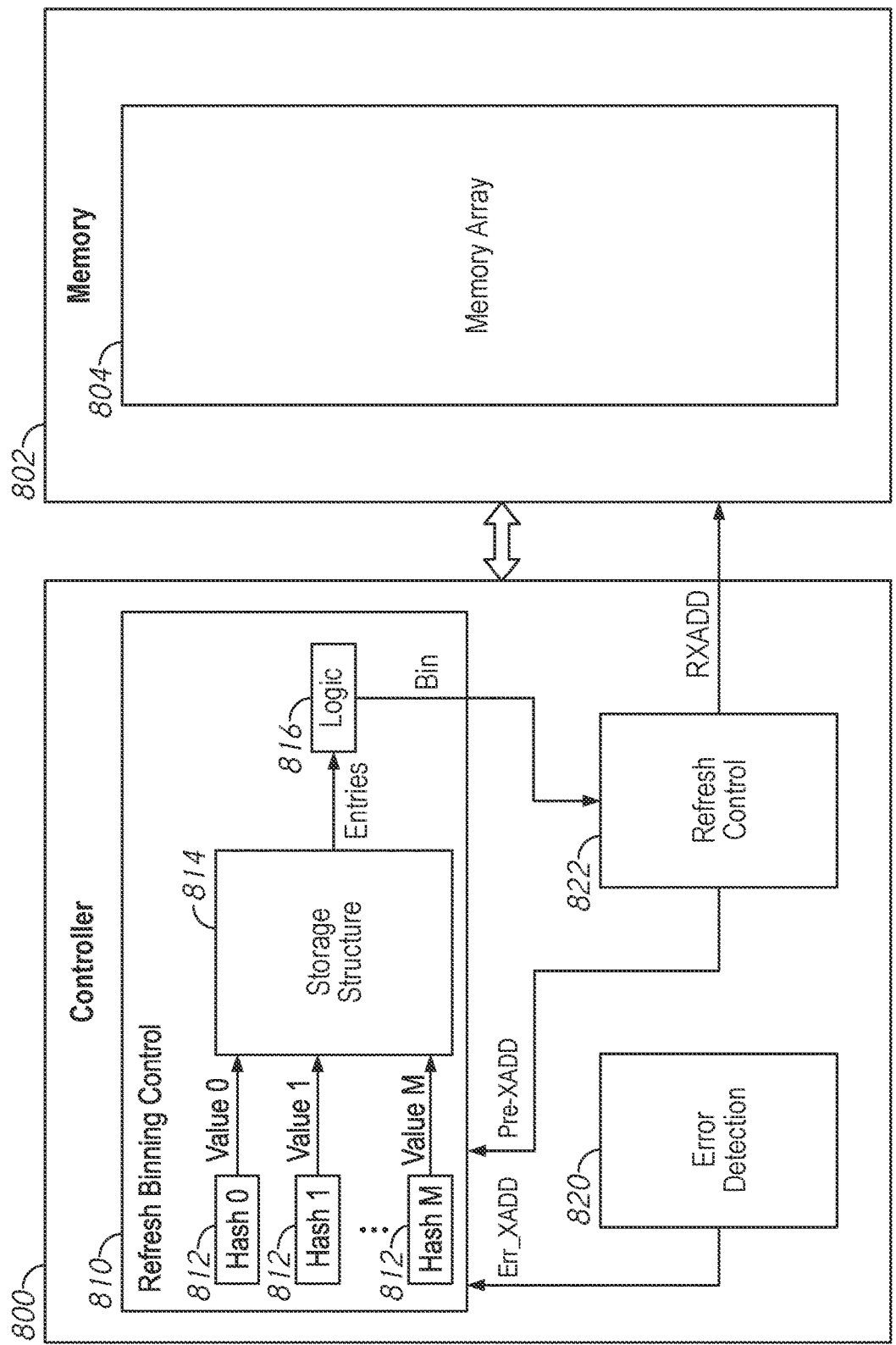
FIG. 8 is a block diagram of a memory system according to some embodiments of the present disclosure.

FIG. 8 is a block diagram of a memory system according to some embodiments of the present disclosure. The memory system may include a memory controller 800 and a memory 802. The controller 800 may operate the memory 802 by providing various commands and signals (e.g., along the C/A terminals, DQ terminals, and CK terminals of FIG. 1). The embodiment of FIG. 8 shows a controller 800 which implements many of the features and structures previously described as components of the memory, for example in the embodiment of FIG. 2. For the sake of brevity, certain structures and operations of FIG. 8 which are analogous to those already described in regards to previous figures will not be repeated in detail with respect to FIG. 8.

The controller 800 includes an error detection circuit 820. The error detection circuit 820 may determine if information read from the memory array 804 of the memory 802 includes an error. In some embodiments, the error detection circuit 820 may be coupled to an error correction code (ECC) circuit, which may be on the memory 804 or controller 800. The error detection circuit 820 may count a number of times that errors are detected in information read from a wordline. When that count meets or exceeds a threshold (which may be 1), then the error detection circuit 820 may flag that row address as being a weak row. The error detection circuit 820 may also use other criteria to identify weal rows. For example, the error detection circuit 820 may be coupled to various testing circuits (e.g., a built-in self-test circuit of the memory 802) which may carry out tests operations to locate weak rows. The identified weak row Err_XADD may be provided to a refresh binning control circuit 810.

The refresh binning control circuit 810 may generate a number of hash values (e.g., Value0 to ValueM) from each a number of hash circuits 812, each of which may implement a different hash operation. The values may be used to index a storage structure and retrieve a number of entries. A logic circuit 816 may then change these entries to indicate that they are associated with an identified weak row address Err_XADD. In the embodiment of FIG. 8, the storage structure may by dynamically updated over time as new weak rows are determined.

The refresh control circuit 822 may generate auto-refresh addresses Pre_XADD and retrieve bin information from the refresh binning control circuit 810 in a manner generally similar to the operation described in FIGS. 2-4. The refresh control circuit 822 may then determine a frequency at which to refresh the auto-refresh address Pre_RXADD based on the bin information (e.g., based on a state of the bin signal Bin). In some embodiments, auto-refresh addresses Pre_XADD which are associated with weak rows may be refreshed more often than other rows.

In some situations, it may be advantageous to have the refresh binning control 810 and refresh control circuit 812 on the controller 800. The controller 800 is aware of when an address is going to be provided as the refresh address RXADD or not. The overall rate of refresh operations may be decreased since weak rows are identified and there is no need to set the overall rate of refresh operations based on the retention time of the weakest row. The reduced rate of refresh operations may allow for the controller 800 to perform more access operations on the memory 802, increasing the bandwidth of the system.

As used herein, an activation of a signal may refer to any portion of a signals waveform that a circuit responds to. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level. One of skill in the art should understand that although embodiments may be described with respect to a particular type of activation used by a particular circuit (e.g., active high), other embodiments may use other types of activation (e.g., active low).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a refresh address generator configured to provide an address;
   a plurality of hash circuits, each configured to generate a respective one of a plurality of hash values based on the address, each hash value of the plurality of hash values comprising a plurality of bits, wherein each of the plurality of hash circuits is configured to implement a different hash operation;
   a logic circuit configured to check a plurality of entries in a storage structure, wherein each of the checked plurality of entries is associated with one of the plurality of hash values, wherein a bin signal is provided based on the checked plurality of entries; and
   wherein the refresh address generator is configured to determine whether to provide the address as a refresh address based on the bin signal.

2. The apparatus of claim 1, wherein the refresh address generator is configured to provide the address responsive to a refresh signal.

3. The apparatus of claim 1, wherein the address is an auto-refresh address.

4. The apparatus of claim 1, wherein the bin signal is provided in an active state if any of the checked plurality of entries is active.

5. The apparatus of claim 1, wherein the refresh address generator is configured to provide the address as the refresh address if the bin signal is in an active state.

6. The apparatus of claim 5, wherein the refresh address generator is configured to not provide the address if the bin signal is in an inactive state and a refresh cycle flag is in an active state.

7. The apparatus of claim 6, wherein a state of the refresh cycle flag is changed each time the refresh address generator completes a refresh cycle.

8. The apparatus of claim 1, wherein the storage structure includes non-volatile storage elements configured to store the plurality of entries.

9. The apparatus of claim 1, wherein each of the plurality of hash circuits is configured to implement a different hash operation.

10. The apparatus of claim 1, further comprising a second refresh address generator configured to provide a second address, wherein the address is provided as the refresh address if the bin signal is active and wherein the second address is provided as the refresh address if the bin signal is inactive.

11. An apparatus comprising
a storage structure comprising a plurality of entries, each of which is associated with one of a plurality of hash circuits and one of a plurality of hash values generated by the associated one of the plurality of hash circuits, wherein each hash value of the plurality of hash values comprises a plurality of bits, wherein each of the plurality of hash circuits is configured to implement a different hash operation;
a refresh control circuit configured to generate a refresh address, check selected ones of the plurality of entries associated with the refresh address and determine a refresh rate of the refresh address based on the selected ones of the plurality of entries.

12. The apparatus of claim 11, further comprising a plurality of hash circuits, each of which is configured to generate a respective one of a plurality of hash values based on the refresh address, wherein the selected ones of the plurality of entries are selected based on the plurality of hash values.

13. The apparatus of claim 11, wherein the refresh control circuit is configured to refresh the refresh address more often based on any of the selected ones of the plurality of entries being active.

14. The apparatus of claim 11, wherein the storage structure and the refresh control circuit are part of a memory.

15. The apparatus of claim 14, wherein states of plurality of entries are set by tester as part of a testing process of the memory.

16. The apparatus of claim 14, wherein states of plurality of entries are set by the memory as part of a post-package repair operation.

17. A method comprising:
generating an address;
generating a plurality of hash values, by a plurality of hash circuits, based on the address, wherein each hash value of the plurality of hash values comprises a plurality of bits, wherein each of the plurality of hash circuits is configured to implement a different hash operation;
checking selected entries in a storage structure based on the plurality of hash values;
determining whether to provide the address as a refresh address based, in part, on values of the selected entries.

18. The method of claim 17, further comprising generating the address as part of an auto-refresh operation.

19. The method of claim 17, further comprising generating the plurality of hash values from each of a plurality of hash operations.

20. The method of claim 17, further comprising providing the address as the refresh address if any of the selected entries are active.

21. The method of claim 17, further comprising:
testing rows of a memory array;
identifying at least one weak row based on the testing;
generating a plurality of hash values based on the at least one weak row; and
setting values of entries in the storage structure based on the plurality of hash values.

22. The method of claim 21, further comprising testing the rows with a tester.

23. The method of claim 21, further comprising setting the values of the entries by changing the state of one or more non-volatile storage elements.

24. A system comprising:
a memory device comprising a plurality of word lines
a controller configured to perform access operations on the plurality of word lines, the controller comprising:
an error detection circuit configured to determine if a word line of the plurality of word lines is a weak word line;
a plurality of hash circuits each configured to generate one of a plurality of hash values based on the weak word line, wherein each hash value of the plurality of hash values comprises a plurality of bits, wherein each of the plurality of hash circuits is configured to implement a different hash operation;
a storage structure configured to store entries indexed by the plurality of hash values;
a refresh control circuit configured to determine a rate of refresh operations based on the entries in the storage structure.

25. The system of claim 24, wherein the controller is configured to refresh the weak word lines more frequently than non-weak word lines.

26. The system of claim 24, wherein the controller is configured to dynamically update the entries in the storage structure.

27. The apparatus of claim 1, wherein the bin signal is indicative of one state of three or more states for the bin signal.

28. The apparatus of claim 1, wherein each hash circuit of the plurality of hash circuits uses a different hash function.

* * * * *